(12) United States Patent
Wu

(10) Patent No.: US 9,164,539 B2
(45) Date of Patent: Oct. 20, 2015

(54) ELECTRONIC DEVICE WITH EJECTION MECHANISM

(71) Applicant: ShenZhen Goldsun Network Intelligence Technology Co., Ltd., Shenzhen (CN)

(72) Inventor: Jian-Guo Wu, Shenzhen (CN)

(73) Assignee: ShenZhen Goldsun Network Intelligence Technology Co., Ltd., ShenZhen (CN)

( * ) Notice: Subject to any disclaimer, the term of this patent is extended or adjusted under 35 U.S.C. 154(b) by 157 days.

(21) Appl. No.: 14/014,386

(22) Filed: Aug. 30, 2013

(65) Prior Publication Data
US 2014/0177144 A1    Jun. 26, 2014

(30) Foreign Application Priority Data
Dec. 22, 2012  (CN) .......................... 2012 1 05616453

(51) Int. Cl.
| | |
|---|---|
| G06F 1/16 | (2006.01) |
| H04M 1/02 | (2006.01) |
| H05K 5/02 | (2006.01) |
| H04B 1/3816 | (2015.01) |

(52) U.S. Cl.
CPC ............ *G06F 1/1613* (2013.01); *G06F 1/1656* (2013.01); *H04B 1/3816* (2013.01); *H04M 1/0202* (2013.01); *H05K 5/0295* (2013.01)

(58) Field of Classification Search
CPC ... H04B 1/3816; G06F 1/1658; H04M 1/026; G06K 13/0825
USPC ..................................... 361/679.38; 439/159
See application file for complete search history.

(56) References Cited

U.S. PATENT DOCUMENTS

| | | | | |
|---|---|---|---|---|
| 5,889,649 | A * | 3/1999 | Nabetani et al. | 361/679.38 |
| 6,008,984 | A * | 12/1999 | Cunningham et al. | 361/679.31 |
| 6,210,188 | B1 * | 4/2001 | Chang | 439/159 |
| 6,814,597 | B1 * | 11/2004 | Kao | 439/159 |
| 6,978,903 | B2 * | 12/2005 | Son et al. | 211/26 |
| 6,991,480 | B2 * | 1/2006 | Katayanagi et al. | 439/159 |
| 7,036,742 | B2 * | 5/2006 | Learmonth et al. | 235/492 |
| 7,442,086 | B1 * | 10/2008 | Chang | 439/630 |
| 8,591,240 | B2 * | 11/2013 | Jenks | 439/159 |
| 8,605,451 | B2 * | 12/2013 | Tang | 361/754 |
| 8,614,897 | B2 * | 12/2013 | Tang | 361/754 |
| 8,947,885 | B2 * | 2/2015 | Wu | 361/754 |
| 8,976,521 | B2 * | 3/2015 | Liu et al. | 361/679.38 |
| 2004/0082210 | A1 * | 4/2004 | Wallace et al. | 439/152 |
| 2008/0316684 | A1 * | 12/2008 | Kilpinen | 361/679 |
| 2011/0255252 | A1 * | 10/2011 | Sloey et al. | 361/752 |
| 2012/0195013 | A1 * | 8/2012 | Trzaskos et al. | 361/754 |
| 2014/0029206 | A1 * | 1/2014 | Wittenberg et al. | 361/728 |
| 2014/0160642 | A1 * | 6/2014 | Wu | 361/679.01 |

* cited by examiner

*Primary Examiner* — Adrian S Wilson
(74) *Attorney, Agent, or Firm* — Novak Druce Connolly Bove + Quigg LLP

(57) ABSTRACT

An exemplary electronic device includes a housing, a tray, and an ejection mechanism. A slot, a receiving groove, and a slit are defined in a sidewall of the housing. The receiving groove includes a main portion and a reduced portion. The tray is received in the housing and aligned with the slot. The ejection mechanism includes a push member, a first magnet, a shield member, and a second magnet. When ejecting the tray, the push member is moved towards the reduced portion and the shield member moves away from the first magnet and the second magnet to generate magnetic force to drive the pivoting member to rotate, the first end portion is urged by the magnetic force to move away from the sidewall of the housing, and the second end portion is driven to push the tray to move outwardly through the slot.

14 Claims, 6 Drawing Sheets

ELECTRONIC DEVICE WITH EJECTION MECHANISM

BACKGROUND

1. Technical Field

The present disclosure relates to electronic devices and, particularly, to an electronic device with an ejection mechanism.

2. Description of Related Art

Electronic devices such as notebook computers may include a retractable tray for holding a storage card. When replacing the storage card of a typical notebook computer, a pin is used to directly insert into a slit of the electronic device to trigger ejection of the tray. This operation requires a tool, concentration by the user, and a high degree of dexterity.

Therefore, what is need is an electronic device with ejection mechanism to overcome the described limitations.

DETAILED DESCRIPTION

Figure 1:
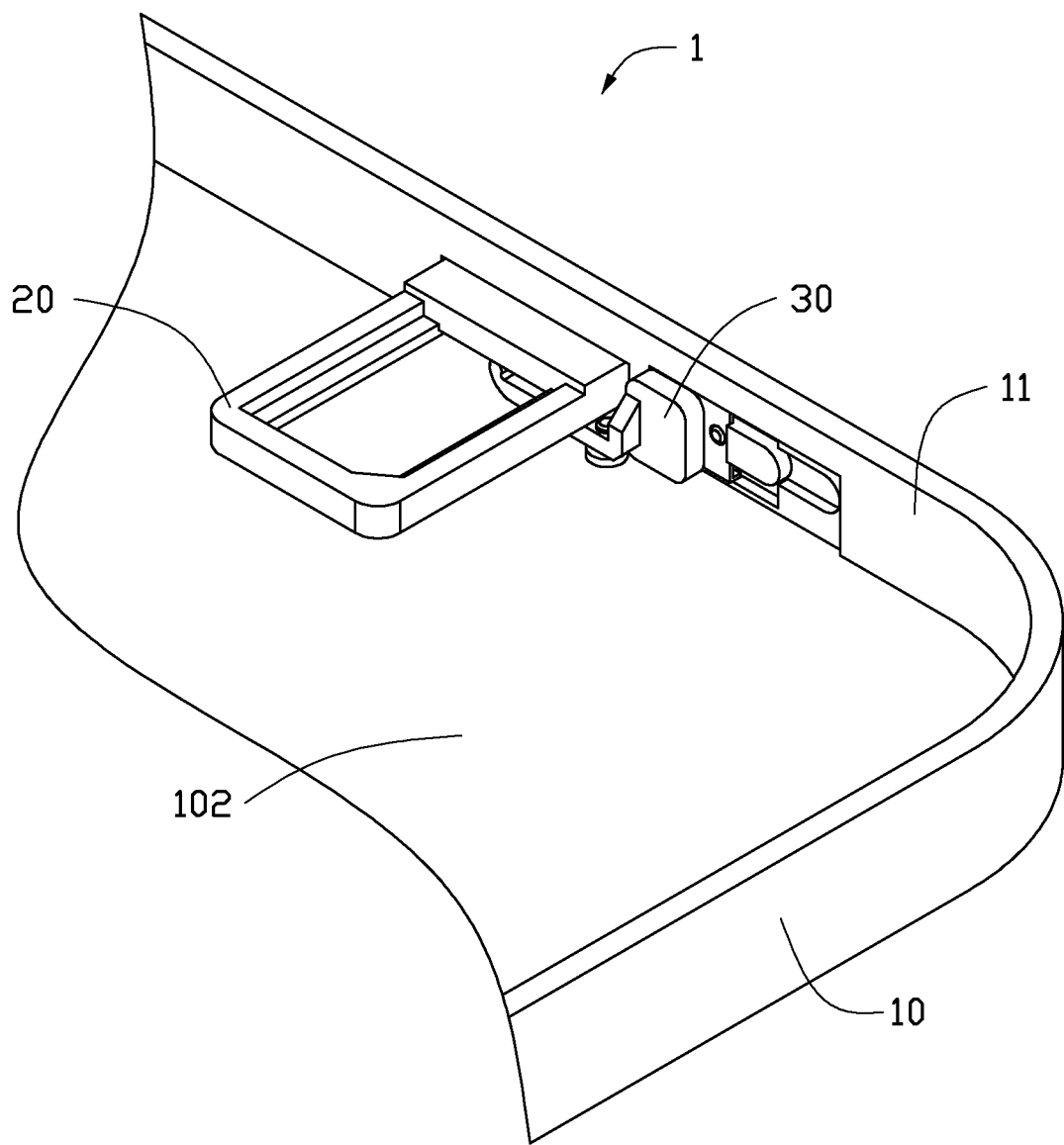
FIG. 1 is a perspective view of part of an electronic device with an ejection mechanism in accordance with an exemplary embodiment, showing a push member thereof in a first position.
Figure 2:
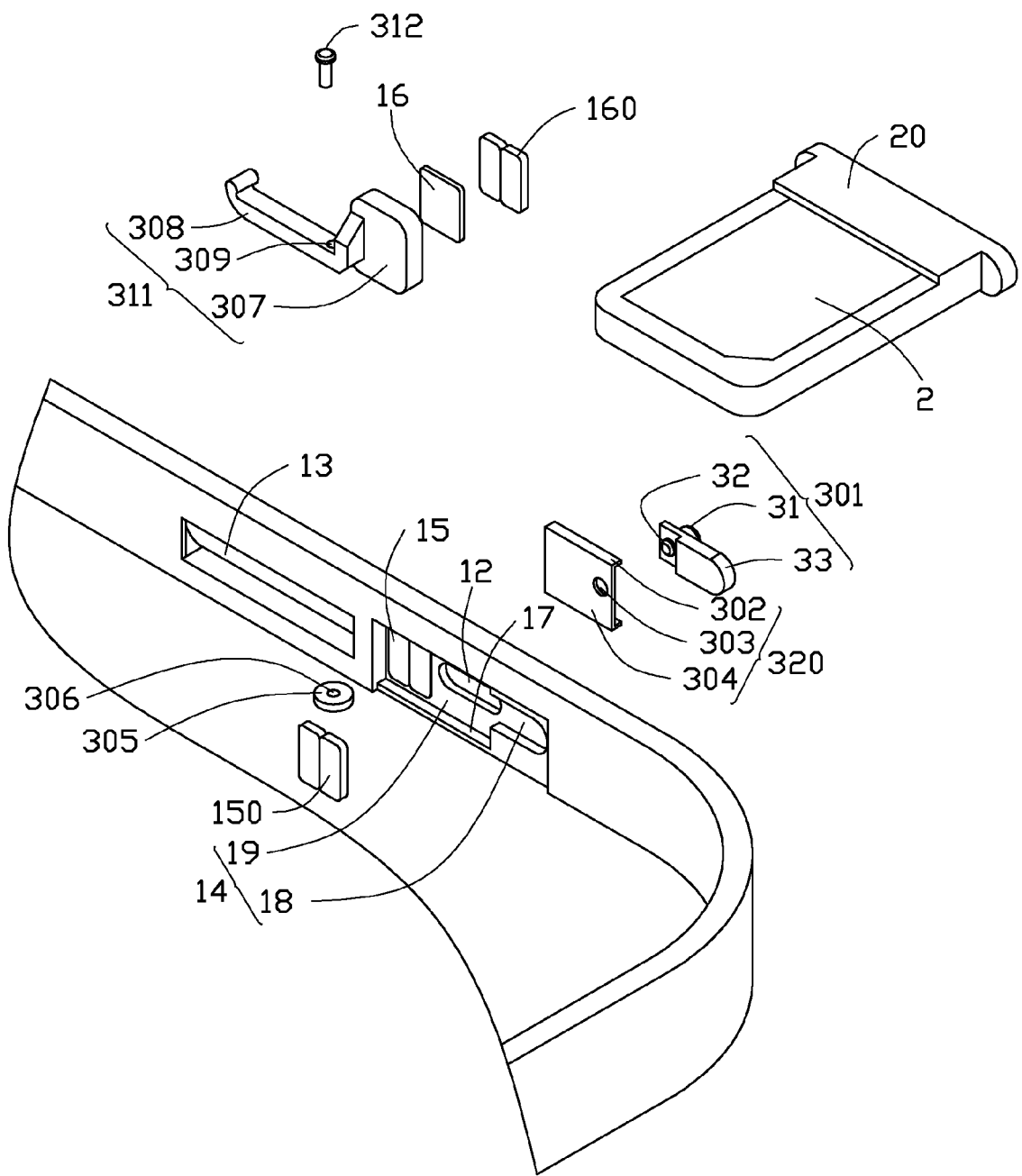
FIG. 2 is an exploded view of the electronic device of FIG. 1, also showing a storage card placed in a tray of the electronic device.
Figure 3:
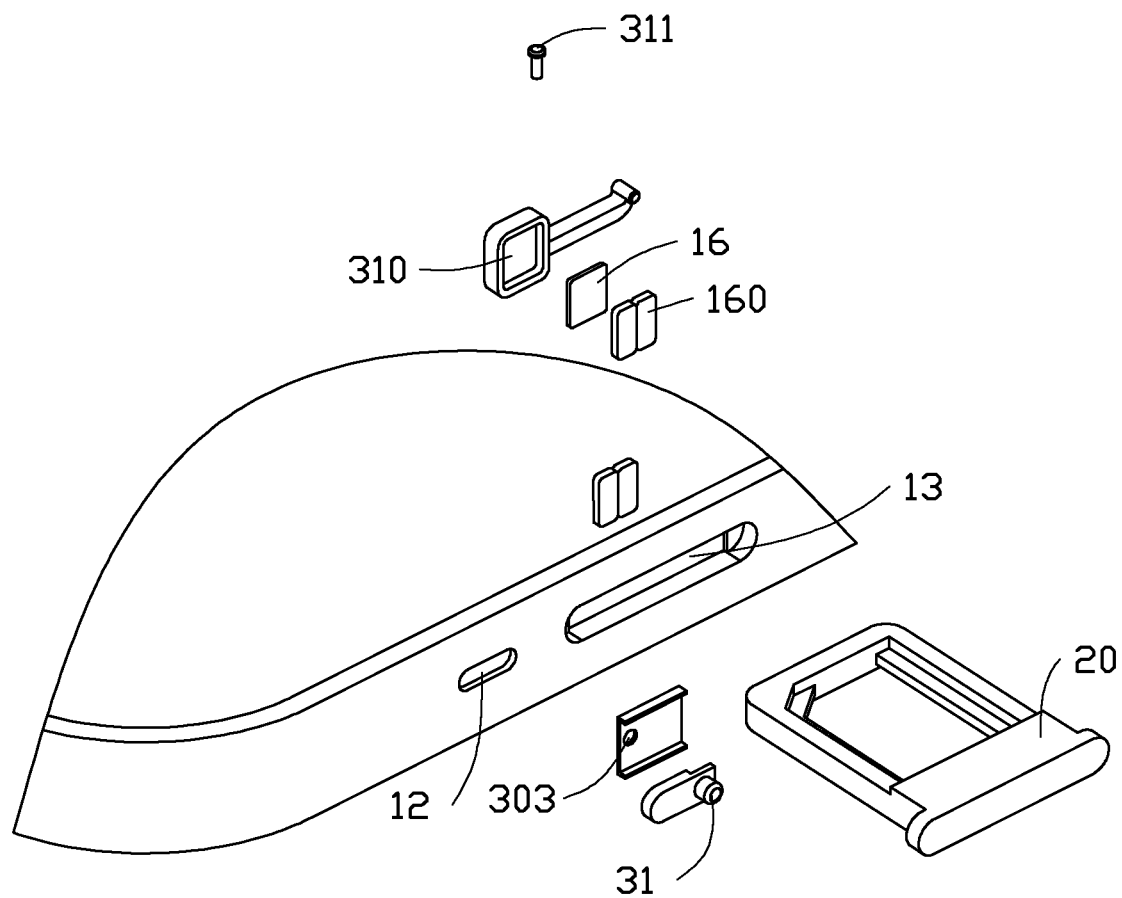
FIG. 3 is similar with FIG. 2, but with the electronic device viewed from another angle, and omitting the storage card.

FIGS. 1-4 show an electronic device 1 of the embodiment. The electronic device 1 includes a housing 10. The housing 10 includes a bottom plate 102 and a sidewall 11. A slot 13 and a slit 12 are defined in the sidewall 11 of the housing 10. The electronic device 1 further includes a tray 20 received in the housing 10 and aligned with the slot 13, and an ejection mechanism 30. A storage card 2 is placed in the tray 20. The ejection mechanism 30 includes a push member 301 slidably engaged in the slit 12, a shield member 320 connected to the push member 301, and a pivoting member 311 pivotably mounted on the bottom plate 102 of the housing 10 via a base ring 305.

Figure 5:
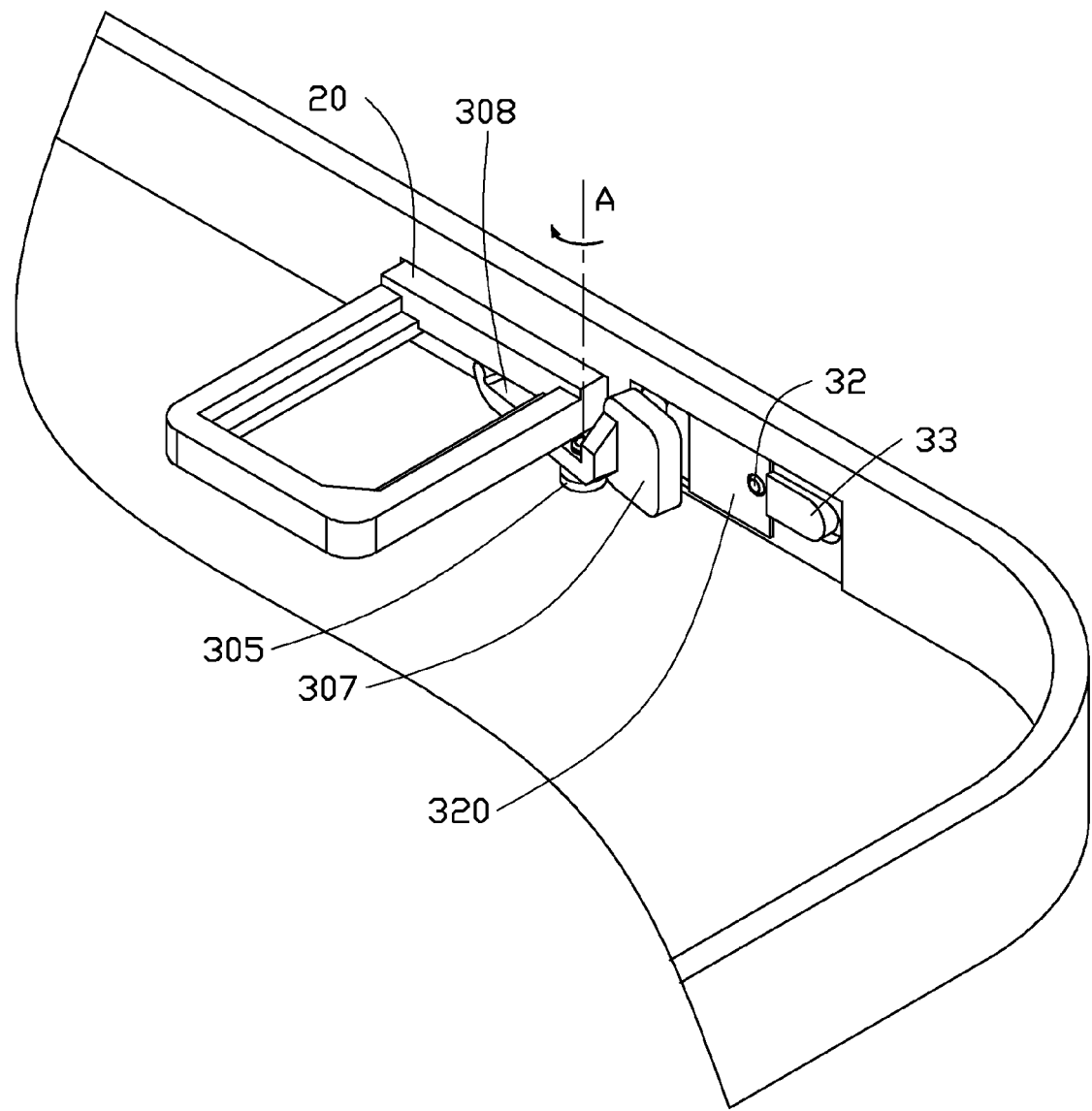
FIG. 5 is similar to FIG. 1, but showing the push member in a second position whereby a tray of the electronic device is ejected.

The electronic device 1 may be a phone, or a notebook computer, for example. The base ring 305 is provided on the bottom plate 102, and is oriented parallel to the bottom plate 102. Referring also to FIG. 5, the pivoting member 311 is rotatable about an axis of rotation "A" defined by the base ring 305, the axis of rotation "A" being perpendicular to the bottom plate 102. The pivoting member 311 includes a first end portion 307 and a second end portion 308. The first end portion 307 and the second end portion 308 are respectively located at two opposite sides of the base ring 305, and are both positioned at a same side of the slit 12. The pivoting member 311 defines a first threaded hole 309 in an intermediate portion thereof near the first end portion 307. A second threaded hole 306 is defined in the base ring 305.

Figure 4:
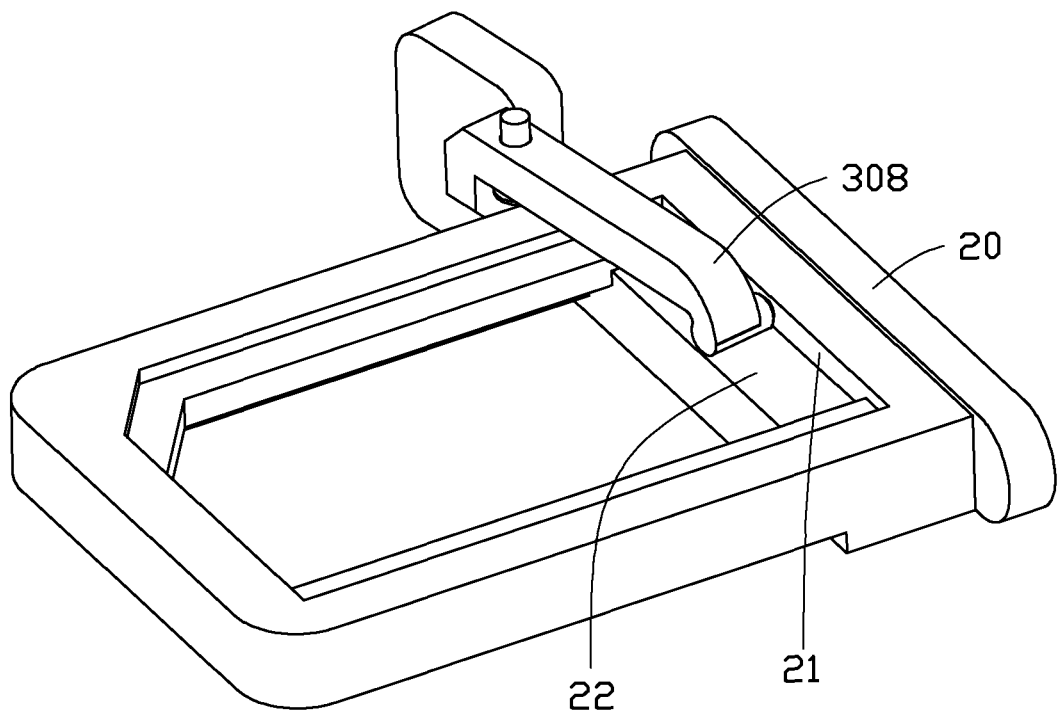
FIG. 4 is a perspective view of a pivoting member and the tray of the electronic device of FIG. 1, showing these parts inverted.

The ejection mechanism 30 further includes a screw 312. The screw 312 passes through the first threaded hole 309 and the second threaded hole 306 to rotatably connect the pivoting member 311 to the base ring 305. The second end portion 308 is opposite to the slot 13 and abuts against and resists the tray 20. As shown in FIG. 4, the second end portion 308 abuts against and resists a sidewall 21 and a bottom wall 22 of the tray 20. A first magnet 160 is attached on the first end portion 307. For example, the first magnet 160 is adhered on the first end portion 307 via a first adhesive element 16, and the first adhesive element 16 is thin double-sided adhesive tape.

In one embodiment, an inner surface portion of the sidewall 11 of the housing 10 defines a receiving groove 14. The receiving groove 14 includes a main portion 19 and a reduced portion 18. The slit 12 is defined in an outer surface portion of the sidewall 11 corresponding to the receiving groove 14, and communicates with the receiving groove 14. The push member 301 includes a base 33, a head portion 31 extending from the base 33 and exposed at an outside of the housing 10, and a protruding portion 32 extending from the base 33 for engaging with the shield member 320. The head portion 31 and the protruding portion 32 are located at opposite sides of the base 33, and are aligned with each other. The base 33 is movably received in the receiving groove 14.

A transverse width of the base 33 (measured in a vertical direction) is substantially equal to a corresponding width of the reduced portion 18, and opposite top and bottom edges of the base 33 are slidably attached to opposite top and bottom surfaces of the reduced portion 18. Thus the base 33 is permanently and slidably engaged in the reduced portion 18, thereby movably fixing the push member 301 to the electronic device 1.

The shield member 320 is movably received in the receiving groove 14. More particularly, the shield member 320 is slidably engaged in the main portion 19. The shield member 320 includes a base board 304, and two flanges 302 perpendicularly extending from opposite top and bottom sides of the base board 304. A transverse width of the base board 304 (measured in a vertical direction) is substantially equal to a corresponding width of the main portion 19. The two flanges 302 are slidably attached to opposite top and bottom surfaces 17 of the receiving groove 14 at the main portion 19. An engaging hole 303 is defined in the base board 304. The protruding portion 32 passes through and is engaged in the engaging hole 303, thereby attaching the push member 301 to the shield member 320. Thus, the shield member 320 moves together with movement of the push member 301.

A second magnet 150 is attached on a sidewall of the main portion 19 at a side of the slit 12. For example, the second magnet 150 is adhered on a sidewall of the main portion 19 at a side of the slit 12 via a second adhesive element 15, and the second adhesive element 15 is thin double-sided adhesive tape. The second magnet 150 is located opposite to the first magnet 160. Same poles of the first magnet 160 and the second magnet 150 are directly opposite each other. For example, a north pole of the first magnet 160 faces a north pole of the second magnet 150, and a south pole of the first magnet 160 faces a south pole of the second magnet 150. The shield member 320 is positionable between the first magnet 160 and the second magnet 150, and is utilized to shield magnetism between the first magnet 160 and the second magnet 150. When the shield member 320 is positioned between the first and second magnets 150, 160, there is essentially no magnetic force between the first and second magnets 150, 160.

When the user slides the head portion 31 of the push member 301 along the slit 12 towards the reduced portion 18 of the receiving groove 14, the shield member 320 moves together with movement of the push member 301 in the main portion 19 and is thus repositioned far from the first magnet 160 and the second magnet 150. When the shield member 320 is moved away from the first magnet 160 and the second magnet 150, the first magnet 160 and the second magnet 150 are face to face and repel each other, thereby generating a magnetic force to drive the pivoting member 311 to rotate.

Figure 6:
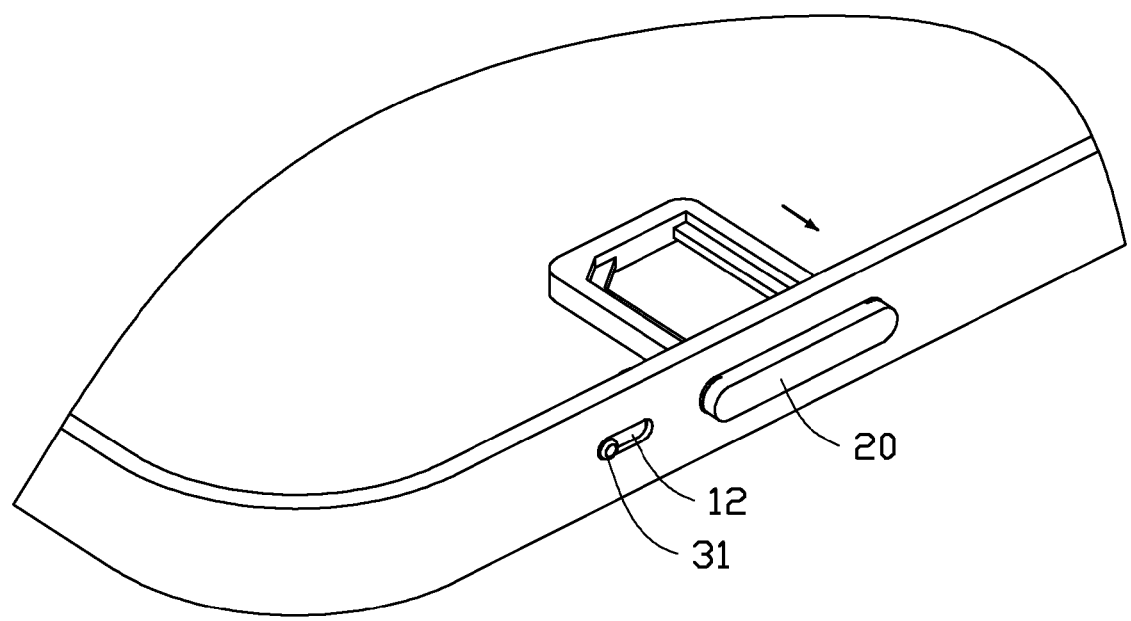
FIG. 6 is similar to FIG. 3, but showing the electronic device assembled, and a process of the tray being ejected from the electronic device.

FIGS. 5-6 show that when ejecting the tray 20, the push member 301 is moved by a user towards the reduced portion 18 of the receiving groove 14, the shield member 320 moves away from the first magnet 160 and the second magnet 150, the first end portion 307 is urged by the magnetic force to move away from the sidewall 11, and the second end portion 308 is driven to push the tray 20 to move outwardly through the slot 13.

Before the tray 20 is pushed back into the housing 10, the push member 301 is moved by the user away from the reduced portion 18 of the receiving groove 14, and the shield member 320 is moved together with movement of the push member 301 to a position opposite the second magnet 150; and in such position, the shield member 320 shields the second magnet 150. When pushing the tray 20 into the housing 10, the pivoting member 311 rotates around the axis of rotation "A" defined by the base ring 305, and the first end portion 307 is moved adjacent to the shield member 320. In this position, the shield member 320 is located between the first magnet 160 and the second magnet 150, and so there is essentially no magnetic force between the first magnet 160 and the second magnet 150. The tray 20 is entirely received in the housing 10.

Although certain embodiments have been specifically described, the disclosure is not to be construed as being limited thereto. Various changes or modifications may be made to the embodiments without departing from the scope and spirit of the disclosure.

What is claimed is:

1. An electronic device comprising:
   a housing including a bottom plate and a sidewall, wherein a slot, a receiving groove, and a slit are defined in the sidewall, the receiving groove comprises a main portion and a reduced portion, and the slit is in communication with the receiving groove;
   a tray received in the housing and aligned with the slot, wherein the tray is configured for supporting a storage card thereon; and
   an ejection mechanism comprising:
      a push member slidably engaged in the slit and the receiving groove, wherein the push member comprises a head portion exposed at an outside of the housing;
      a pivoting member rotatably mounted on the bottom plate of the housing via a base ring, wherein the pivoting member is rotatable about an axis of rotation defined by the base ring, the pivoting member comprises a first end portion and a second end portion, the first end portion and the second end portion are located at two opposite sides of the base ring and at a same side of the slit, and the second end portion is opposite to the slot and resists the tray;
      a first magnet attached on the first end portion;
      a shield member movably engaged in the main portion, wherein the shield member is connected to the push member and moves together with movement of the push member; and
      a second magnet attached on a sidewall of the main portion at a side of the slit, wherein same poles of the first magnet and the second magnet are directly opposite each other, and the shield member is positionable between the first magnet and the second magnet, and is utilized to shield magnetism between the first magnet and the second magnet;
   wherein when ejecting the tray, the push member is moved towards the reduced portion, the shield member moves away from the first magnet and the second magnet, the first and second magnets generate magnetic force therebetween and drive the pivoting member to rotate, the first end portion is urged by the magnetic force to move away from the sidewall of the housing, and the second end portion is driven to push the tray to move outwardly through the slot.

2. The electronic device as described claim 1, wherein the shield member comprises a base board and two flanges perpendicularly extending from opposite top and bottom sides of the base board.

3. The electronic device as described claim 2, wherein a transverse width of the base board is substantially equal to a corresponding width of the main portion, and the two flanges are slidably attached to two opposite surfaces of the receiving groove at the main portion.

4. The electronic device as described claim 1, wherein when the push member is moved away from the reduced portion of the receiving groove, the shield member is moved together with movement of the push member to a position opposite the second magnet, and thus the shield member shields the second magnet.

5. The electronic device as described claim 4, wherein when the shield member shields the second magnet and the tray is pushed into the housing to be entirely received in the housing, the pivoting member rotates around the axis of rotation, the first end portion is moved adjacent to the shield member, the shield member is thus located between the first magnet and the second magnet such that there is no magnetic force between the first magnet and the second magnet, and the second end portion abuts against the tray.

6. The electronic device as described claim 1, wherein the push member further comprises a protruding portion, and the head portion and the protruding portion are located at two opposite sides of the push member and are aligned with each other.

7. The electronic device as described claim 6, wherein an engaging hole is defined in the base board and the protruding portion extends through the engaging hole thereby connecting the shield member to the push member.

8. An electronic device comprising:
   a housing including a bottom plate and a sidewall, wherein a slot, a receiving groove, and a slit are defined in the sidewall, the receiving groove comprises a main portion and a reduced portion extending from an end of the main portion far from the slot and aligned with the main portion, and the slit is in communication with the receiving groove;
   a tray received in the housing and aligned with the slot, wherein the tray is configured for holding a storage card thereon; and
   an ejection mechanism comprising:
      a push member slidably engaged in the slit and the receiving groove, wherein the push member comprises an external head portion for manual operation by a user;
      a pivoting member rotatably mounted inside the housing, wherein the pivoting member is rotatable about an axis of rotation that is substantially perpendicular to the bottom plate, the pivoting member comprises a first end portion and a second end portion located at two opposite sides of the axis of rotation, and the second end portion is opposite to the slot and resists the tray;

a first magnet attached on the first end portion;

a shield member slidably engaged in the main portion, wherein the shield member is connected to the push member and moves in unison with movement of the push member; and a second magnet attached on a sidewall of the main portion at a side of the slit, wherein same poles of the first magnet and the second magnet are directly opposite each other, and the shield member is slidable to a position between the first magnet and the second magnet to shield magnetism between the first magnet and the second magnet;

wherein when the push member is moved towards the reduced portion, the shield member is slid away from the first magnet and the second magnet, the first and second magnets generate magnetic force therebetween and drive the first end portion to rotate away from the sidewall of the housing, and the second end portion is driven to eject the tray out through the slot.

9. The electronic device as described claim 8, wherein the shield member comprises a base board and two flanges perpendicularly extending from opposite top and bottom sides of the base board.

10. The electronic device as described claim 9, wherein a transverse width of the base board is substantially equal to a corresponding width of the main portion, and the two flanges are slidably attached to two opposite surfaces of the receiving groove at the main portion.

11. The electronic device as described claim 8, wherein when the push member is moved away from the reduced portion of the receiving groove, the shield member is moved together with movement of the push member to a position opposite the second magnet, and thus the shield member shields the second magnet.

12. The electronic device as described claim 11, wherein when the shield member shields the second magnet and the tray is pushed into the housing to be entirely received in the housing, the pivoting member rotates around the axis of rotation, the first end portion is moved adjacent to the shield member, the shield member is thus located between the first magnet and the second magnet such that there is no magnetic force between the first magnet and the second magnet, and the second end portion abuts against the tray.

13. The electronic device as described claim 8, wherein the push member further comprises a protruding portion, and the head portion and the protruding portion are located at two opposite sides of the push member and are aligned with each other.

14. The electronic device as described claim 13, wherein an engaging hole is defined in the base board and the protruding portion extends through the engaging hole thereby connecting the shield member to the push member.

* * * * *